United States Patent [19]
Ruckert et al.

[11] 4,144,067
[45] Mar. 13, 1979

[54] LIGHT-SENSITIVE COPYING MATERIAL AND METHOD FOR THE PRODUCTION OF COLORED RELIEF IMAGES

[75] Inventors: Hans Ruckert, Naurod; Rainer Unholz, Wiesbaden, both of Fed. Rep. of Germany

[73] Assignee: Hoechst Aktiengesellschaft, Fed. Rep. of Germany

[21] Appl. No.: 826,738

[22] Filed: Aug. 22, 1977

[30] Foreign Application Priority Data

Aug. 21, 1976 [DE] Fed. Rep. of Germany ....... 2637768

[51] Int. Cl.$^2$ ................. G03C 5/00; G03C 11/00; G03C 1/52; G03C 1/68
[52] U.S. Cl. ............................. 96/36; 96/47; 96/91 R; 96/115 R
[58] Field of Search ................. 96/91 R, 115 R, 36, 96/47

[56] References Cited

U.S. PATENT DOCUMENTS

| | | | |
|---|---|---|---|
| 3,099,558 | 7/1963 | Levinos | 96/91 R |
| 3,745,011 | 7/1973 | Hudgin | 96/88 |
| 3,867,147 | 2/1975 | Teuscher | 96/33 |
| 3,909,273 | 9/1975 | Levinos | 96/91 R |
| 3,918,977 | 11/1975 | Hammond | 96/115 R |

OTHER PUBLICATIONS

Chem. Absts., vol. 84, 1976, p. 416, 10941f.
Kosar, Light Sensitive Systems, 1965, pp. 158–193.

Primary Examiner—Mary F. Kelley
Attorney, Agent, or Firm—James E. Bryan

[57] ABSTRACT

This invention relates to an improvement in a light-sensitive copying material, the copying layer of which comprises a water-soluble, curable binder and a diazonium salt polycondensation product of recurring units of the general types ($A$-$N_2X$) and (B) which are linked to one another by intermediate members which have two bonds and are derived from a carbonyl compound capable of undergoing a condensation reaction, wherein A is the radical of a compound which contains at least two isocyclic or heterocyclic aromatic rings and is able to undergo a condensation reaction, at least at one point in the molecule, with formaldehyde in an acid medium, B is the radical of a compound which is free of diazonium groups and is able to undergo a condensation reaction, at least at one point in the molecule, with formaldehyde in an acid medium, and X is the anion of an acid which forms a water-soluble salt with the condensation product, the improvement being that fish glue is the water-soluble, curable binder. The invention also relates to a process for the production of colored relief images.

13 Claims, No Drawings

LIGHT-SENSITIVE COPYING MATERIAL AND METHOD FOR THE PRODUCTION OF COLORED RELIEF IMAGES

The invention relates to a negative-working light-sensitive copying material and a method for processing this material to give colored relief images which can be used as a replacement for silver films or as colored images of any desired color shade. The copying material is composed of a transparent carrier and a light-curable, water-soluble copying layer and is coated under aqueous conditions, developed under aqueous conditions, and the areas which have been exposed are stained with aqueous dyestuff solutions.

When producing original copies for the preparation of printing forms for offset printing, letterpress printing, screen printing and halftone gravure printing, a silver litho film is usually exposed, by means of a reproduction camera, to an original image or a paste-up and a halftone screen. After photographic developing, fixing and washing, silver films (soft dot films) which are used, or can be used, as the original copy are obtained. Frequently, however, this halftone original copy is recopied by contact copying to produce a silver hard dot film copy with reverse tonality, depending upon whether a positive or negative original copy is desired and whether the starting film was a conventional lithographic film or a silver duplicate (autoreversal) film.

In order to produce the recopied films or film assembly of the original, at least the same amount of relatively expensive silver film material is again required. Added to this are the expenditure and the processing material for developing, usually in an expensive film developing machine.

Transparent separation images, in the three primary colors and black, are produced using silver film original copies and, in the case of color separations, usually a set of four original copies, and these separation images can be used as color test films or as proof substitutes. Light-sensitive color films which are suitable for this purpose are available with a positive-working or negative-working layer which, in each case, is already stained to the corresponding color shade.

Positive-working diazo materials for duplicating silver films are already employed in the graphics industry. These materials are diazotype material on pretreated polyester films and, on the areas which have not been exposed, azo dyestuffs which are opaque in the ultraviolet range are formed upon treatment with ammonia or aqueous solutions of amines or alkali metal salts by means of a coupling reaction. Films which can be developed under aqueous-alkaline conditions (DT-OS No. 1,572,085) also are known as duplicating films and these carry a layer of o-naphthoquinone diazide and colored substances which increase the photographic density to more than 1. On the same basis, positive color films with different staining are known for mounting control and also as a proof substitute (German Pat. No. 1,291,197, and DT-OS No. 1,447,019).

The principle of using one copying layer for different applications, such as color films of any desired color shade, also is already known, however, using photopolymer layers and colored pigments (U.S. Pat. Nos. 3,060,024 and 3,060,025) and also by means of laminating (DT-AS No. 2,004,214). The suppression of the dyestuff absorption capacity in the exposed and cross-linked parts of the layer also has been applied to other systems which in themselves are negative-working and to staining with oil-soluble dyestuffs, in which case, thus, positive images are formed (DT-AS No. 2,040,136).

Several systems also already have been described for reversal films and for negative color films. Attempts to reduce the disadvantages of silver film, i.e., the high price of silver and the lack of transparency in the visual region of the spectrum, are known. Thus, for example, according to DT-OS No. 2,506,445, and others, diazo compounds can be used in silver halide/gelatin layers in order to form layers which are opaque to UV light but transparent to visible light. Another process (DT-OS No. 1,772,146) uses the reaction of a photographic layer with reducing agents in order to produce colored images.

Layers of negative-working systems, which are in themselves known and which can be used in a single layer or double layer to produce photomasks or colored film images work completely without silver halide. However, photopolymer layers, which are appropriately stained according to German Pat. No. 1,171,267, do not give the necessary high density values with acceptable exposure times. An attempt therefore has been made to overcome this disadvantage by separating the dyestuff and the photopolymer layer (DT-OS No. 2,202,360), but this apparently is achieved at the expense of the resolution which can be obtained. Special photopolymer layers (DT-OS No. 2,360,350) can be pre-dyed with soluble or pigment dyestuffs or can be stained with substantive dyestuffs after copying.

Layers based on azido or diazo compounds make it possible to obtain higher resolution. It is known of azido compounds, and especially of base-substituted azidoazomethines according to DT-OS No. 1,572,067, or azidodiphenylamine derivatives according to DT-OS No. 2,450,430, that they become intensely colored upon exposure. A large number of azido compounds which are in themselves known have been examined in more detail to determine their usefulness for photomasks and these compounds have been claimed (DT-OS No. 2,435,390). Because of the increasing masking upon exposure, however, a reliable copy can be obtained only with difficulty with an acceptable exposure time and at densities of more than 2.

According to DT-OS No. 2,437,382, the use of triazolium or tetrazolium salts and photo-reducing agents and also, according to DT-OS No. 2,215,719, the coloring of vesicular film with pigments have been proposed as a further possibility for obtaining masking colored images. With both processes, the transparency in the non-image areas apparently suffices only when the demands in respect of original copy material are relatively low.

Furthermore, it is known according to DT-AS No. 1,133,243, to use diazo resins in combination with color-pigmented covering layers or color-pigmented (DT-GM No. 7,316,607) and also, according to DT-OS No. 1,622,686, stained, p-benzoquinone diazide or p-benzoquinone iminodiazide layers for negative color films. Precoated copying material, which is stable upon storage, for the production of color proofing films according to DT-OS No. 2,032,947, also has been described, based on the diazo co-condensation products according to DT-OS No. 2,024,244, which are soluble in organic solvents.

Finally, in DT-OS No. 2,310,825, a lithographic material and process also have been described in which a layer of gelatin of a certain type in combination with a diazodiphenylamine/formaldehyde condensation product (diazo resin) is stained with aqueous dyestuff solutions.

Furthermore, a light-sensitive copying composition for the production of screen printing stencils, which contains, as the light-sensitive compound, a condensation product of an aromatic diazonium compound, for example a diphenylamine-4-diazonium salt, and a specific compound capable of undergoing a condensation reaction therewith, is described in DT-OS No. 2,041,395. This compound preferably has the general formula $E(-CHR_a-OR_b)_m$, wherein E denotes the m-valent group of a compound which is able to undergo a condensation reaction with formaldehyde in an acid medium, $R_a$ denotes H or an alkyl or aryl group, $R_b$ denotes H or an alkyl, acyl or phenyl group and m denotes an integer from 1 to 10.

The condensation product is in the form of the salt of an aliphatic monosulfonic acid with 1 to 6 carbon atoms.

The copying composition also contains a water-soluble, curable binder, preferably polyvinyl alcohol. In order that the stencil can be better discerned, the composition also can contain dyestuffs and pigments, but these are not present in a concentration such that this results in a substantial increase in the photographic density of the layer.

It is also known, from the book "Die Lichtgerbung" ("Light Tanning") by O. Watter, VEB Wilhelm Knapp Verlag, Halle (Saale), (1953), page 105, to use light-curable layers of bichromate and fish glue for block making, especially on copper plates.

The object of the present invention is to provide a copying material which has a light-curable layer and in the cured state can be irreversibly stained to intense color shades with dyestuff solutions, especially those which have high absorption in the visible and actinic region of the spectrum.

The invention is based upon a light-sensitive copying material, the copying layer of which is composed of a water-soluble, curable binder and a diazonium salt polycondensation product of recurring units of the general types (A-N$_2$X) and (B), which are linked to one another by intermediate members which have two bonds and are derived from a carbonyl compound capable of undergoing a condensation reaction, especially by methylene groups, wherein A is the radical of a compound which contains at least two isocyclic or heterocyclic aromatic rings and is able to undergo a condensation reaction, at least at one point in the molecule, with formaldehyde in an acid medium, B is the radical of a compound which is free from diazonium groups and is able to undergo a condensation reaction, at least at one point in its molecule, with formaldehyde in an acid medium, especially the radical of an aromatic amine or of a phenol, thiophenol, phenol ether, aromatic thioether or aromatic hydrocarbon or of an aromatic heterocyclic compound or of an organic acid amide and X is the anion of an acid which forms a water-soluble salt with the condensation product, preferably the anion of an aliphatic monosulfonic acid with 1 to 6 carbon atoms.

The symbol A is preferably the radical of a compound of the formula

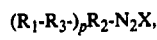

in which X has the meaning indicated above, p denotes an integer from 1 to 3, preferably 1, $R_1$ denotes an aromatic radical with at least one position capable of entering into a condensation reaction, $R_2$ denotes a phenylene group which is unsubstituted or substituted by halogen atoms or carboxyl, sulfonyl, alkyl or alkoxy groups and $R_3$ denotes a single bond or one of the groups:

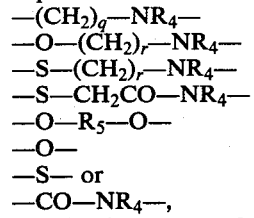

in which q is a number from 0 to 5, r is a number from 2 to 5, $R_4$ is hydrogen, an alkyl group with 1 to 5 carbon atoms, an aralkyl group with 7 to 12 carbon atoms or an aryl group with 6 to 12 carbon atoms, and $R_5$ is an arylene group with 6 to 12 carbon atoms.

The copying material according to the invention contains fish glue as the water-soluble, curable binder.

Furthermore, according to the invention a process for the production of colored relief images is proposed in which a copying material of the composition indicated above is exposed, the regions of the layer which have not been exposed are washed out with water, and the residual relief image is stained with an aqueous dyestuff solution.

Suitable dyestuffs are, in particular, reactive dyestuffs, substantive dyestuffs and acid dyestuffs. Staining is advantageously carried out at temperatures in the range of 15° to 50° C. The concentration of the dyestuff solution preferably is 0.5 to 5% by weight.

The diazonium salt condensation products used in the copying material according to the invention are known. They are manufactured from the starting compounds by a condensation reaction in a strongly acid medium, especially in concentrated sulfuric acid, orthophosphoric acid or methanesulfonic acid. The starting compounds are either the diazonium salt A-N$_2$X, compound B and a carbonyl compound capable of undergoing a condensation reaction, especially formaldehyde, or, alternatively, A-N$_2$X and $E(-CHR_a-OR_b)_m$ with the meaning explained initially. The manufacture is described in detail in U.S. Pat. No. 3,867,147.

Among the abovementioned condensation products, those in which the units B or E are derived from diphenyl ethers, diphenyl sulfides, diphenylmethanes and diphenyls are particularly preferred.

The anion X can be any anion which imparts solubility in water to the condensation product. It is possible to use, for example, chlorides, bromides, sulfates, acid phosphates and the like. The anions of aliphatic monosulfonic acids with 1 to 6 carbon atoms, and especially methanesulfonate, are preferred.

In many respects, the copying materials according to the invention are superior to the known materials of the same type which contain, instead of fish glue, water-soluble synthetic polymers, such as polyvinyl alcohol, or polypeptides or proteins of natural origin, such as gelatin, casein or gluten glue. They are distinguished by the fact that they can be cast from aqueous solutions at standard temperature, in contrast to the photogelatin layers, which must be cast warm, and by surprisingly good adhesion, even on non-pretreated polyester films and glass as the carriers, gloss, high sensitivity to light and, at the same time, good stability upon storage and by the extreme ease with which they can be developed with water, coupled with outstanding developer resistance and, above all, by outstanding irreversible stainability with numerous dyestuffs. In principle, all the reactive substantive and acid dyestuffs which can be used for dyeing fur, leather and wool can be used. Because of the good resistance, they also can be stained with acid and direct dyestuffs which are not adequately soluble in water but are soluble in water-miscible solvents. UV absorbers also can be added to these solutions.

The stainability of protein or polypeptide layers with suitable dyestuffs already has long been known as the pinatype process and the greater stainability of the parts of the bichromate/gelatin layer which are less extensively cross-linked, compared with more extensively exposed and cross-linked parts of the image, has been utilized for positive continuous tone color images. The outstanding stainability of the copying materials according to the invention even in an extremely overexposed and completely cross-linked state is apparently related not only to the fact that fish glue is more readily soluble and cross-linkable, compared with gelatin, but also to the properties of the high molecular weight diazo compounds used.

The copying material according to the invention is composed of the carrier and the light-sensitive negative copying layer, which is stable upon storage and can be developed with water, applied to one side or, in some cases, to both sides of the carrier. Materials which can be used as carriers are the materials conventional for photographic layers and color film formulations, such as plastic films, but also special papers and clean, degreased glass plates. Dimensionally stable, biaxially stretched polyester films, preferably of glass-clear photoquality, are preferred. It was surprising that the layers according to the invention, which generally are 0.5–10μ thick, adhere well to these carriers without pretreatment and display good adhesion even upon developing. White-pigmented films, which are suitable as carriers for color separation reflection images and continuous tone images, also can be used. Papers with a water-resistant coating and synthetic papers also can be used.

Although, when copying line images and screen images, the image parts are in relief on the carrier film after developing and act as an anti-Newton layer during further copying, it is also possible advantageously to use carriers with rougher surfaces and layer carriers which have been pretreated on one side or both sides and provided with an anti-Newton lacquer layer. Both normal biaxially stretched polyester films and polyester films pretreated in the customary manner with trichloroacetic acid, and also cellulose ester lacquer layers with a total thickness of up to 10μ which are provided with silica or other pigments can be used as the carrier film. In this case, when the exposed layer is stained, no fogging or background development takes place at the areas of the carrier surface which have not been exposed and are laid open during developing. Because the provision of a substrate is necessary only to roughen the surface and not to promote adhesion, it preferably is carried out only on the side of the carrier film opposite the copying layer.

Other materials, for example polyvinyl chloride and cellulose acetate films and metal foils made of aluminum, anodized aluminum, copper, chromium and steel also can be used as carriers.

The copying layer is composed of a diazonium salt condensation product (diazo co-condensate) and fish glue. The condensation products used here effect in the material a considerably greater sensitivity to light and stability on storage than do the condensation products of a diphenylamine diazonium salt and formaldehyde (diazo resins) which are otherwise conventional.

The amount of the diazo compound in the layer can vary considerably. In general, relatively less diazo co-condensate than diazo resin is required for a comparable cross-linking effect. The proportion of diazo co-condensate is generally between 2 and 40% by weight of the solid constituents of the layer. The preferred range is between about 5 and 25% by weight.

Layers if fish glue containing a diazo co-condensate are generally at least 2–3 times more sensitive to light than layers of fish glue containing the same amount of a diazo resin. The sensitivity to light of corresponding layers is not substantially changed by varying the amount of diazo co-condensate. If it is desired to reduce the sensitivity to light of such layers it is appropriate to replace up to 50% by weight of the diazo co-condensate by a diazo resin. A chloride-free and metal-salt free diazo resin according to DT-AS No. 1,289,741, is preferably used for this purpose. It is also possible to also use other negative-working light-sensitive compounds in addition to the diazo co-condensate. By adding, for example, relatively small amounts of 4,4'-diazido-stilbene-2,2-disulfonic acid, the image areas already can be stained yellow-brown by exposure. For the production of color films, however, the layer should contain only a diazo co-condensate.

The primary constituent of the copying layer of the copying material according to the invention is fish glue. According to data given by the manufacturers, and in the literature, the quality of fish glues is highly dependent upon the type of fish, the fish collagens used, the boiling conditions and the purification. A feature common to all fish glues is that, in contrast to gelatins obtained from mammals, they are readily soluble in water and these solutions are liquid at standard temperature, i.e., they have not gelled.

Preferred grades of fish glue are those which are slightly turbid to pale yellow and clear and, in combination with bichromate, are customarily used as photocopying glues for the production of blocks, in which case the layers, after copying, must be rendered resistant to etching by baking (heat treatment). The fish glue from Norland Products Inc., New Brunswick, N.J., U.S.A., which is termed Photoengraving Glue and is obtainable commercially as an approximately 45% by weight aqueous non-gelling solution which is as clear as gelatin and of constant quality and viscosity, is particularly preferred. The layers according to the invention produced with this glue have glossy clear surfaces and need not be heated after developing. Nevertheless, they have relatively good resistance to etching and good stability on storage.

In order to vary the properties such as the ease of development, the capacity for swelling, the layer thickness, the adhesion, the resistance to etching, and the ease with which the cured layer can be stripped by alkaline means, the layers of fish glue can be modified by additives. In principle, all the water-soluble synthetic and natural polymers can be added. Even polyvinyl alcohol displays only slight intolerance phenomena in amounts of up to about 10% by weight, relative to the fish glue. However, polypeptides and proteins of natural origin or polyvinyl compounds which contain carboxamide groups are preferred and these can be added in amounts of up to about 80% by weight of the fish glue.

In order to slow down the developing process, which is usually very rapid, at the parts of the layer which have not been exposed, up to about 30% by weight of gelatin and, with less success, smaller amounts of special caseins, polyacrylamides, and vinylacetate homo- and copolymer dispersions can be added. The addition of polyvinyl pyrrolidone, its copolymers and polyvinyl alkylacetamides is preferred for the modification of the layer of fish glue. If necessary, these water-soluble polymers can be dissolved more rapidly and to give a clearer solution by also using methanol, ethanol, or isopropanol, prior to adding the polymers to the fish glue solution. Such solvents can be added to the coating solvent, namely water, in amounts of up to about 10% by weight without adverse effects.

In order to facilitate developing and staining, salts, such as acetates, sulfates and phosphates, for example those of sodium, potassium, magnesium or aluminum, which at the same time can act as buffers, and, in addition, non-ionic and cationic wetting agents and also biocidal agents can be added. Finally, it is also possible to disperse finely divided pigments such as silica (Aerosils), titanium dioxide, aluminum silicates or also polyvinyl acetate powder as fillers in an amount of up to about 40% by weight (relative to solids) in the coating solution. The coating solution generally should have a pH value in the range of 2.5 to 7 and preferably of 2.5 to 5.

In order to enable an assessment to be made already during coating and exposure in respect to the thickness and exposure time of the layers which are to be stained only after developing, the layers, which in themselves are clear and slightly yellowish are already slightly stained red, for example with small amounts of Rhodamine 6 GDN extra (C.I. 45,160), blue, for example with Crystal Violet (C.I. 42,555) or with copper phthalocyanine dispersion, or yellow-brown, for example with 4,4'-diazostilbene-2,2'-disulfonic acid, and/or, as an incipient solution in ethanol/water, with the indicator dyestuffs bromocresol purple or bromophenol blue, in each case in an amount of up to 10% by weight, relative to the amount of diazo compound.

The gradation of the layer also can be distinctly changed by means of additives. UV absorbers enable a steeper gradation of the copy obtained with conventional layer-on-layer exposure, at the expense of the sensitivity to light, and at the same time act as a protection against diffusion halation. The resolution can be further improved by providing protection against reflected light halation and this is usually effected by a thin layer of dyestuff, for example water-soluble diamine brown M concentrated (C.I. 22,311) on one of the two surfaces of the film. The UV absorbers are added in amounts such that, for an approximately 3μ thick layer, the characteristic density at 395 nm does not exceed a value of 1.0, because otherwise the sensitivity to light no longer meets the requirements in practice. Water-miscible solvents also can be used to dissolve the UV absorbers and these remain in homogeneous distribution after addition to the coating solution.

It is more advantageous to retain the high sensitivity to light of the copying material according to the invention and to build up the desired photographic density and color after exposure and developing respectively. The utilization of chemical reactions in the layer offers one possibility for achieving this. Preferably, however, a treatment is carried out with dyestuff solutions which irreversibly stain the layers. The combination of the two methods and after-treatment of the stained layer are further possibilities for producing the final colored image on the carrier.

The undecomposed diazo compound still present after optimum exposure, which is determined by means of a half-tone step wedge, can be used, for example, for azo coupling. For this purpose, a coupling component in an alkaline medium is applied during or after developing. Phenylmethylpyrazolone or phenylpyrazolone carboxylic acid are the most advantageous but the effect is too slight for staining on its own.

Among the color-forming metal reagents, the formation of black lead sulfide from lead acetate, which is homogeneously distributed in the layer, and highly diluted hydrogen sulfide solution is best utilized. This reaction can be carried out rapidly and in a manner which strengthens the layer, without undesirable odors. Masking by lead sulfide is spectrally advantageous over the entire UV and visible region and densities above 1.5 can be easily obtained.

Staining with dyestuff solutions offers the greatest effect and the most diverse possibilities for building up the photographic density or a coloration in the exposed and cross-linked parts of the layer. The material according to the invention is distinguished by the fact that layers of fish glue offer particularly good prerequisites for intense and durable staining coupled with good copying characteristics.

Although a certain hardening usually takes place even at the non-image areas when staining is carried out prior to developing, layers of fish glue nevertheless still can be developed rapidly. The reason for this and the advantage of layers of fish glue is, apparently, that upon treatment with aqueous dyestuff solutions, the solubility of the non-exposed parts is not only substantially greater than in the case of other layers but also, conversely, the curing action by the dyestuff is relatively slight.

For these reasons, simultaneous developing and staining is possible with the fish glue/diazo co-condensate layers according to the invention. Nevertheless, it is preferred to carry out developing and staining separately in two working steps in order to avoid a change in the staining solution by enrichment with non-exposed layer substance, in order to obtain constant staining, especially in the case of color films.

Because of the high differentiation of the diazo co-condensate/fish glue layers in readily soluble non-image areas and strongly cross-linked image regions which adhere to the carrier, developing with water is not critical, i.e., the layers have a high resistance to developer.

Developing can be carried out by immersion in photographic dishes or cells, rinsing in a developing basin and washing by spraying or automatically in commercially available apparatuses. These can be both continuous immersion apparatuses, such as are used for the developing of silver films, and continuous spray apparatuses, such as have been introduced for developing presensitized planographic printing plates. In spray apparatuses, the film to be developed is appropriately fastened to a rigid plate, for example a used aluminum planographic printing plate, and transported thereon. In order to achieve better wetting or cleaning of the surface, surface-active substances, salts or acids, for example cationic or non-ionic wetting agents, borax or phosphoric acid, optionally also can be added to the water used for developing.

Automated developing is appropriately combined with automated staining. The continuous immersion and spray apparatuses mentioned usually possess three (or more) chambers and are also suitable for aqueous dyestuff solutions. By varying the rate of throughput and the processing temperature, developing and staining can be well adjusted to one another and the conditions can be set to those most advantageous in practice. Under optimized conditions, such apparatuses reproducibly give constant original copy films and color films.

For special purposes, for example in cartography, the material according to the invention also can be processed stepwise in several layers. Thus, after taking the first copy and staining, for example black for names, the material is coated again, exposed, using another original copy, developed and stained with another color, for example blue for stretches of water. In order to represent contour lines, woodland and the like, multi-color images on transparent or white carriers can be produced by repeated coating, exposure using the particular negative original copy and staining brown and then green, and the like. In each case developing can be automated and staining appropriately can be carried out manually.

A multiplicity of dyestuffs from at least three categories of dyestuffs which give irreversible dyeings, i.e., dyeings which are substantially permanent and fast to wet processing, can be used for staining the exposed fish glue/diazo co-condensate layers. These dyestuffs are reactive dyestuffs, substantive dyestuffs and acid dyestuffs and an intermediate classification is possible in the case of some dyestuffs. Surface-active agents and/or salts for buffering can be added to the dyestuff solutions.

In the case of reactive dyestuffs it is assumed that under the most advantageous time/temperature/pH conditions for staining, which in each case are determined empirically, the dyestuff molecule is linked by a chemical bond to a protein molecule of the fish glue. In the case of substantive dyestuffs, on the other hand, it can be assumed that the mechanisms for the absorption on and adherence to proteins and polypeptides are like those for cellulose (Angewandte Chemie 75 (1963) 407–416). In the case of acid dyestuffs, salt formation with basic groups of the fish glue is probable and salt formation with unexposed diazo co-condensate is also known.

The following reactive, substantive and acid dyestuffs, which have a solubility in water, absorption characteristics, fastness to wet processing and density or color which makes them appear particularly suitable for film original copies which mask in the UV range or for color films and decorative films, have been found for the material and process according to the invention. The number of possible dyestuffs is not intended to be limited by this arbitrary selection. In addition, some dyestuffs which can in themselves be used and are derived from intermediate products which are known to be carcinogenic, for example benzidine and 2-naphthylamine, have deliberately been excluded.

| Reactive dyestuffs Name | Color Index Name | No. |
| --- | --- | --- |
| Remazol Brilliant Orange RR: | Reactive Orange 7 | |
| Remazol Brilliant Orange 3R: | Reactive Orange 16 | |
| Remazol Brilliant Orange FR: | | |
| Remazol Golden Orange 4G: | | |
| Remazol Golden Orange 3G: | | |
| Remazol Yellow RTN: | Reactive Yellow 24 | |
| Remazol Golden Yellow G: | Reactive Yellow 17 | 18,852 |
| Remazol Red B: | Reactive Red 22 | |
| Remazol Brilliant Red SBB:*) | | |

*) When no C.I. data are given, the dyestuff has not as yet been included in the 3rd edition (1971) of the Color Index.

| Substantive dyestuffs Name | Color Index Name | No. |
| --- | --- | --- |
| Rayon Fast Black B highly concentrated: | Direct Black 10 | 35,255 |
| Coranil Direct Black F: | Direct Black 38 | 30,235 |
| Diamine Fast Grey BN: | Direct Black 51 | 27,720 |
| Coranil Orange HE: | Direct Orange 17 | 19,160 |
| Dianil Orange G: | Direct Orange 17 | 19,160 |
| Diamine Fast Orange D: | Direct Orange 15 | 40,002/ 40,003 |
| Diamine Orange BC extra: | Direct Orange 18 | 20,215/ 20,216 20,230 |
| Congo Red: | Direct Red 28 | 22,120 |
| Dianil Yellow 3 G: | Direct Yellow 22 | 13,925 |
| Sirius Light Yellow R extra: | Direct Yellow 50 | 29,025 |
| Diamine Brown M concentrated: | Direct Brown 2 | 22,311 |

Dyestuffs from other categories which proved useful are:

| | | |
| --- | --- | --- |
| Orasol Black B-A, B-V: | Solvent Black 6 | |
| Zapon Fast Black B, RE: | Solvent Black 34 | 12,195 |
| Orasol Orange RW-A, RW-V: | Solvent Orange 10 | |
| Salicin Chromium Grey GL: | Mordant Black 65 | 18,170 |
| Erio Chromium Azurol BA: | Mordant Blue | 43,830 |
| Alizarin Yellow GG: | Mordant Yellow 1 | 14,025 |
| Alizarin Yellow R: | Mordant Orange 1 | 14,030 |
| Alizarin Yellow RS: | | |

| Acid Dyestuffs Name | Color Index Name | No. |
| --- | --- | --- |
| Benzyl Orange 2 R | Acid Orange 45 | 22,195 |
| Coranil Fast Orange RR | Acid Orange 107 | |
| Supranol Orange GS | Acid Orange 56 | 22,895 |
| Brilliant Yellow | | 10,317 |
| Coranil Yellow HE 3 G | Acid Yellow 56 | 24,825 |
| Fast Light Yellow G | Acid Yellow 11:1 | |
| Fast Light Yellow 3 G | Acid Yellow 13 | 19,120 |
| Fast Light Yellow X | Acid Yellow 55 | 19,040 |
| Palatin Fast Yellow GRN | Acid Yellow 99 | 13,900 |
| Anthralan Red B concentrated | Acid Red 42 | 17,070 |
| Anthralan Red BBT | Acid Red 81 | 68,200 |
| Anthralan Red HGK | Acid Red 288 | |
| Alphanol Fast Red R | | 23,635 |
| Coranil Brown HEEG | Acid Brown 104 | |
| Coranil Brown HEGR | Acid Brown 105 | 33,530 |
| Anthralan Blue B | Acid Blue 41 | 62,130 |
| Fullers Yellow H 3 G | Schultz Dyestuff Tables (7th Edition) No. 230 | |
| Poplin Yellow G | Acid Yellow 9 | 13,015 |
| Remalan Fast Black G | Acid Black 138 | |

Special shades and, thus, special effects (decorative colors for graphic use), can be achieved under comparable conditions using the dyestuffs listed below:

| Name | | Color Index Name | No. |
| --- | --- | --- | --- |
| Yellow: | Remaderm Yellow HPR | Acid Yellow 36 | |
| | Remaderm Yellow H 5 G | — | |
| | Remaderm Yellow HR | — | |
| | Capracyl Yellow NW | Acid Yellow 51 | |
| | Pinatype Yellow D, F, R | — | |
| Orange: | Pinatype Orange | | |
| | Nubilon Orange R | Acid Orange 7 | |
| Red: | Alphanol Fast Brilliant Red BL | — | |
| | Amidorhodamine B concentrated | Acid Red 52 | |
| | Lanaperl Red G | — | 22,245 |
| | Nubilon Red RR | — | |
| | Remaderm Red HPB | | |
| | Remazol Brilliant Red FB | Reactive Red 104 | |
| | Remazol Brilliant Red BB | Reactive Red 21 | |
| | Remazol Brilliant Red GG | Reactive Red 106 | |

-continued

| Name | | Color Index Name | No. |
|---|---|---|---|
| | Remazol Brilliant Red SBB | — | |
| | Remazol Brilliant Red F 3 B, 6 B | | |
| | Remazol Ruby GR | — | |
| Red: | Ponceau RR | Acid Red 26:1 | 16,151 |
| | | | 16,150 |
| | Ponceau Red 6 | | 16,290 |
| | Ponceau Red 6 R | | |
| Blue: | Duasyn Acid Blue SN | Acid Blue 93:1 | |
| | Nubilon Blue BS | — | |
| | Remaderm blue HBL | Direct Blue 199 | |
| | Duasyn Direct Violet B | Direct Violet 9 | |
| Green: | Duasyn Acid Green V Type 8005 | Acid Green 16 | |

The copying material can be stained even during coating using such dyestuffs in low concentration. This is advisable only when the loss in sensitivity to light which is associated therewith is unimportant. In such cases the addition of UV absorbers to the layer is to be preferred and the gradation can be more effectively made steeper by this means.

Benzophenone derivatives which have a solubility in water of more than 5%, for example Cyasorb UV 284 and Uvinul MS 40 and DS 49, can be used as UV absorbers. Cyasorb UV 24 and Cyasorb UV 12, which are less soluble, possess good and long-wave absorption even at a low dosage. Further UV absorbers which can be used are described in Karsten, "Lackrohstoff-Tabellen" ("Lacquer Raw Material Tables"), 5th Edition, pages 440–441.

An additional possibility for use of the material according to the invention which has been described above is the production of continuous tone images. While the layer acquires a high density gradient (steep gradation), as a complement to the masking effect of the unexposed diazo compound, when UV absorbers and/or masking dyestuffs are added, on normal exposure directed to the layer side, the effect on exposure from the rear side is precisely the reverse. The light coming through the carrier film then cures the layer most strongly in the side of the layer which adjoins the carrier film and least in the surface of the layer which faces away from the carrier film. Even with a relatively short exposure to a continuous tone wedge from the side of the clear or translucent carrier film, it can be clearly seen that the layer becomes thinner, as a result of developing, at the less exposed areas and is correspondingly less intensely colored at these areas upon staining. With this procedure, the copying layer possesses a gentle gradation, which is the gentler the higher the content of the UV absorber.

While the negative-working copying layer is customarily used for the reversal of line and screen objects, it can be used for recopying continuous tone images using the variant described. It is immaterial whether exposure to a positive continuous tone original copy is through the rear side and a negative continuous tone image is formed after the developing and staining or vice versa. The dyestuffs mentioned also can be used for this procedure. Thus, continuous tone color images, for example continuous tone color separations, also can be produced.

When the layers are used for continuous tone work, it is advantageous not only to add UV absorbers, but also to make the layers somewhat thicker, layer thicknesses of about 4–8μ being preferred. View-through continuous tone images are obtained when a transparent film is used and continuous tone reflection images are obtained on an opaque white carrier. In most cases, the somewhat longer exposure time and the loss in sharpness caused by light scattering in the opaque film and the pigmented layer which may be present, compared with a transparent carrier film, can be accepted. When the halftone image is stained with a dyestuff which masks UV light, additional copies can be made analogously using this image, so that, for example, the continuous tone positive drawn from a continuous tone negative can be compared with the original continuous tone positive in respect of gradation and extent of tonality. It is possible to optimize the layer formulation for the desired application by means of such generation copies.

Finally, a further possibility and an advantage of this copying material which is inexpensive and, in respect of procedure and color, can be processed to diverse end products, is that the colored effluents can be purified by the processor, even though they are already free from toxic substances. For this purpose, commercially available flocculating agents based on polyacrylamide or carboxymethylcellulose are added to these dyestuff solutions or to dyestuff solutions which are exhausted or have not been consumed. In order to improve separation and to bring the dyestuffs into a form in which they can be better filtered, it is in many cases advantageous first to add metal salt solutions, which can precipitate the dyestuff as a colloid, and to use cationically modified polyacrylamides. The most advantageous data in respect of procedure, type, concentration and other sedimentation and clarification conditions must be determined in each case.

The examples which follow further illustrate embodiments of the invention. All the percentage figures and quantity ratios are to be understood as units by weight unless otherwise stated. The layer thicknesses were measured in the dry state.

EXAMPLE 1

5 g of the diazo co-condensate of 2 moles of 3-methoxy-diphenylamine-4-diazonium sulfate and 1 mole of 4,4'-bis-methoxymethyl-diphenyl ether, isolated as the methanesulfonate, 80 g of fish glue (Special Photoengraving Glue from Messrs. O. Ring, 2 Hamburg 11, with a solids content of approximately 50%) and 0.2 g of Rhodamine 6 GDN extra (C.I. 45,160) are dissolved in 500 ml of water and a biaxially stretched 75μ thick polyester film is provided with an approximately 4μ thick coating (dry thickness) using this solution.

The copying layer is exposed under a negative test original copy for 50 seconds using a 5 KW metal halide lamp with a MO 23 Sylvania burner at a distance of 140 cm, and then developed by rinsing the areas which have not been exposed for at most 1 minute with tap water and stained intense black by immersion of the exposed areas, in the course of 3 minutes, at 30° C., in a 5% solution of Coranil Direct Black B (C.I. Direct Black 19). A density of 2.2 was measured at 395 nm with a photovolt densitometer using the filter combination consisting of UG 3/2 mm, BG 12/2 mm, KG 1/2 mm and GG 337/2 mm from Messrs. Schott, $T_{max}=54\%$, HW 57 nm.

Accordingly, when this positive test image is used as the photographic original copy in place of a corresponding silver film original copy for copying commercially available presensitized positive printing plates which contain o-naphthoquinone diazide sulfonic acid esters as the light-sensitive substance, a clean image of the original copy on the printing plate can be obtained even with exposure 10 times the normal, i.e., the stained parts of the layer of the film provide more than the necessary masking.

Dyestuff solution which is exhausted or no longer required can be purified from the intensely coloring dyestuff by flocculation. For this purpose, a metal salt solution, such as aluminum sulfate or ferric chloride, is added and the metal salt of the dyestuff is converted into a form in which it can be filtered by adding a polyacrylamide flocculating agent, for example a 0.2% solution of a polyacrylamide having a molecular weight of $1-2 \cdot 10^6$.

EXAMPLE 2

10 g of the diazo co-condensate of 1 mole of 3-methoxy-diphenylamine-4-diazonium sulfate and 1 mole of 1,3-dihydroxymethyl-4,6-diisopropyl-benzene, isolated as the methane sulfonate, 100 g of aqueous fish glue solution (Photoengraving Glue from Norland Products Inc., New Brunswick, N.J., USA, with an appoximately 45% solids content and of approximately 6,000 cP), 2 g of magnesium sulfate . 7H$_2$O and 0.2 g of a non-ionic wetting agent (polyoxyethylene nonylphenyl ether) are dissolved in 500 ml of water.

A 50$\mu$ thick biaxially stretched polyester film of photographic quality, which has been pretreated on both sides with trichloroacetic acid in order to improve the surface against the formation of Newton rings on exposure, and has been matted with a layer of cellulose acetate-propionate, to which a conventional slip agent has been added, is coated with this solution.

Copying thereon and staining with an aqueous solution of Poplin Yellow G (C.I. 13,015) gives a clean yellow image on a fog-free background and can be used for further copying.

EXAMPLE 3

4 g of the diazo co-condensate of 1 mole of 3-methoxy-diphenylamine-4-diazonium sulfate and 1 mole of 4,4'-bismethoxymethyl-diphenyl ether, isolated as the methane sulfonate, and 100 g of a fish glue as in Example 2 are dissolved in 500 ml of water and four films are coated with this solution, with a layer weight of about 2.0 g/m$^2$ in each case. One carrier film is composed of a polyester film (187.5$\mu$ thick) which has been colored white and the three other films consist of 100$\mu$ thick transparent polyester films.

In order to check the montage for color separations, the coated films are each exposed for 45 seconds under the four screened silver film color separations under a 5 KW COP XP 5000 xenon point light copying lamp from Messrs. Staub, Neu-Isenburg, at a distance of 140 cm, the blue separation being produced on the white carrier. Then, all four films are developed by immersing for about 1 minute in a water-filled cell and, for staining, the films are each immersed for about 3 minutes in cells containing the following solutions:

| | |
|---|---|
| 1.5% of Remaderm Blue HBL | C.I. Direct Blue 199 |
| 4 % of Remazol Golden Yellow G | C.I. 18,852 |
| 3 % of Remazol Brilliant Red SBB | — |
| 4 % of Coranil Direct Black F | C.I. 30,235 |

After rinsing with water, the four color separation films are dried. A reflection copy similar to the proof is obtained by laying the films on top of one another in accordance with the printing sequence. If the blue separation is also produced on a transparent film, the same image is obtained as a transparency.

EXAMPLE 4

8 g of the diazo co-condensate of 1 mole of 2,4',5-triethoxy-diphenyl-4-diazonium salt and 1 mole of 4,4'-bismethoxymethyl-diphenyl ether, isolated as the methane sulfonate, 54 g of a fish glue as in Example 2, 12 g of partially saponified polyvinyl alcohol of medium viscosity (Mowiol 26-88) and 1 g of a commercially available biocidal agent (Mergal AF, Riedel de Haen), the main constituent and active compound of which is chloracetamide, are dissolved in 400 ml of water.

This formulation was compared with a corresponding layer containing only fish glue and the diazo compound, in each case after applying a layer thickness of about 4$\mu$ to a polyester film, stepwise exposure for 50-150 seconds using a 5 KW MH lamp under a 60-screen and 120-screen and a 13-step continuous tone test wedge, developing with a spray and staining with an aqueous dyestuff solution containing 1% of Congo Red (C.I. 22,120) and 1% of Diamine Fast Gray BN (C.I. 27,720).

Clear differences are apparent even upon developing. The non-uniform PVA-containing layer cannot be developed cleanly even when it is wiped over; the limit of developability is at about 10% of PVA, relative to the fish glue. The pure fish glue layer is rapidly and cleanly open upon rinsing with or immersing in water.

On staining, the red-brown color is pale and uneven in the case of the PVA-containing layer. Staining is better and more intense with clean light and deep points, even in the 120-screen, in the case of the pure fish glue layer. After immersing for 3 minutes at 30° C., a density of 2.8 was measured at 395 nm. The extinction curve shows a density of at least 2.8 in the spectral region from 300-550 nm. This layer also displays the same UV masking after treatment with an acid aqueous solution, for example 3% phosphoric acid. As a result of the indicator action of Congo Red, the red-brown image points are reversibly re-dyed black during this treatment. Using an original copy of this type, commercially available negative planographic printing plates with diazo layers and a commercially available photopolymer planographic printing plate were each exposed for up to 8 times the normal exposure time. Non-scumming printing plates were obtained.

EXAMPLE 5

2 g of the diazo compound indicated in Example 1, 40 g of fish glue as in Example 2, 5 g of Rovita FN 4 (digested milk protein (casein) from Rovita GmbH, Aschau bei Kraiburg) and 0.1 g of Crystal Violet (C.I. 42,555) are dissolved in 200 ml of water.

A 180$\mu$ thick polyester film is coated with this solution, exposed and stained intense black in the course of 3 minutes using a 2% methanolic solution of Orasol Black BA (C.I. Solvent Black 6).

The addition of casein makes the layer somewhat harder and renders it slower to develop. Staining from an alcoholic solution instead of from an aqueous dyestuff solution is possible without attack to the layer but is indicated only if no corresponding aqueous dyestuff solution is available.

EXAMPLE 6

2 g of the diazo co-condensate as in Example 3, 40 g of fish glue as in Example 2 and 0.5 g of aluminum sulfate . 18H$_2$O are dissolved in 200 ml of water and a 50μ thick biaxially stretched polyester film is coated in a thickness of about 5μ with this solution.

After exposure in the customary manner, also using continuous tone and screen test step wedges so that step 3 of a 13-step continuous tone test wedge remains covered, developing and staining are carried out automatically after one another in a continuous immersion apparatus. For this purpose, water is filled into chamber 1 of the Durst RCP 20 bench continuous apparatus (9 cm/minute) and an aqueous dyestuff solution of 1.5% of Alizarin Yellow R (C.I. 14,030) and 1.5% of Alizarin Yellow RS (C.I. Mordant Orange 15) are filled into chamber 3 and the thermostat of the apparatus is set to 30° C. If developing is carried out manually by immersion in a dish or cell containing water, staining can be carried out in chamber 1 and rinsing in chambers 2 and 3.

Using this apparatus, which was designed for developing silver images, the diazo copying layers described here also can be processed continuously and with reproducible results. Excess dyestuff solution is squeezed off at the end of the apparatus by rubber rollers. The concentration of the dyestuff solution can be checked photometrically and, if necessary, made up by adding concentrated dyestuff solution. The intensely yellow-colored films also can be rinsed for a prolonged period or collected in a washing basin without any noticeable drop in density occurring with this layer which is resistant to wet processing, i.e., it does not bleed.

The resulting films can be used for copying positive and negative copying layers which are sensitive to UV light. Compared with silver film original copies, they have the advantage that, because of their visual transparency, registration can be effected easily in the case of montages and in the case of bored circuit boards. Similar results are obtained when a mixture of 1% of Brilliant Yellow (C.I. 10,317) and 2% of Palatin Fast Yellow GRN (C.I. 13,900) is used as the dyeing solution.

EXAMPLE 7

60 g of a fish glue as in Example 1, 20 g of a diazo co-condensate as in Example 3, 20 g of vinyl pyrrolidone/butene copolymer solution (approximately 40% solution in isopropanol), 1 g of lead acetate trihydrate and 2 g of 7-diethylamino-4-methyl-coumarin are dissolved in 500 ml of water and a 50μ thick polyester film which has been colored white is coated in a thickness of about 5 g/m$^2$ with this solution.

The film is exposed for 3 minutes under a negative line original copy using the Printaphot tube exposure apparatus from Fotoclark, fixed to an aluminum plate in a spray developing apparatus, developed with water which is cycled by pumping and treated, in a second chamber, with 0.1% NaSH solution. By this means, a brown-black PbS precipitate is produced imagewise in the layer. This has a density of 1.3 with a base density of the film of about 0.2.

If the same material is exposed through the white film for 2 minutes under a negative continuous tone transparency and developed, and blackened, in the same way, a gray-black positive continuous tone image is formed.

In order to deepen the black and the density to above 2.5, the two images are immersed in a 3% solution of Remalan Fast Black G (C.I. Acid Black 138) for 2 minutes at 40° C., rinsed and dried. The action of the two color-forming solutions also can be combined but this brings no advantages; staining solely by means of a dyestuff solution is to be preferred.

EXAMPLE 8

10 g of the diazo co-condensate of Example 3, 60 g of a fish glue as in Example 2 and 20 g of polyvinyl methylacetamide are dissolved in 500 ml of water and 30 g of finely ground titanium dioxide are dispersed in the solution.

Using this solution, a 100μ thick, biaxially stretched polyester film is coated in a thickness of about 10μ. This copying material is exposed for 150 seconds under a negative original copy using a 5 KW MH lamp at a distance of 140 cm and the parts of the layer which have not been exposed are removed in the course of 1-2 minutes by spraying with water.

This gives a white image on a transparent carrier which is particularly suitable for the production of lettering, tables, diagrams and drawings, for example by means of an episcope or of overhead projectors. Being a reflection image, this material can be yet further modified for different applications, for example by subsequently writing on the white surface with a marking pencil or drawing ink or by scratching in symbols. In addition, the white material can be stained as desired in various color shades, depending upon the part of the subject, for example for cartographic purposes. Depending upon the desired depth of color, 0.5% to 5% aqueous solutions of the following dyestuffs have proved useful:

| | | |
|---|---|---|
| blue | Duasyn Acid Blue SN | (C.I. Acid Blue 93:1) |
| | Duasyn Acid Direct Violet B | (C.I. Direct Violet 9) |
| green | Duasyn Acid Green V, Type 8005 | (C.I. Acid Green 16) |
| yellow | Remaderm Yellow HPR | (C.I. Acid Yellow 36) |
| | Pinatype Yellow F | |
| orange | Nubilon Orange R | (C.I. Acid Orange 7) |
| red | Ponceau Red 6 R | (C.I. 16,290) |
| | Lanaperl Red G | (C.I. 22,245) |
| black | Remaderm BlacK HKN | |
| | Amido Black HTT | |

These layers also can be processed analogously on glass as the carrier, instead of on polyester film, because good adhesion is achieved by the fish glue. In addition, opaque white films, for example a white-pigmented plasticized PVC film, or mechanically roughened aluminum are also suitable as carriers. The carrier surface and the dyestuff are to be so suited that the carrier does not take up any color at the non-image areas.

EXAMPLE 9

8 g of the diazo co-condensate as in Example 1, 90 g of a fish glue as in Example 2, 15 g of polyvinyl pyrrolidone and 4 g of Cyasorb UV 284 benzophenone derivative, previously dissolved in 50 ml of ethanol, are dissolved in 450 ml of water and a 80μ thick softened cellulose acetate film is coated in a thickness of about 6μ using this solution.

The layer is exposed through the acetate film for 2 minutes to halftone negatives from an amateur silver film in a commercially available contact copying apparatus. Then, the layer is developed by rinsing with water for 1 minute and stained in a 3% aqueous solution of Salicin Chromium Gray GL (C.I. 18,170) for 2 minutes.

This gives gray-black positive continuous tone view-through images, for example black-and-white transparencies from miniature negatives. When an opaque white film is used as the carrier, positive reflection images of miniature films are obtained analogously and these can be used in place of positive silver paper image contact copies to assess the negatives.

With normal exposure, i.e., layer on layer with line or screen negatives, and conventional developing and staining, a clean positive of the original copy is obtained from the layer, which is hard in use.

EXAMPLE 10

6 g of the diazo co-condensate from Example 3, 100 g of a fish glue as in Example 2 and 1 g of $MgSO_4 \cdot 7H_2O$ are dissolved in 500 ml of water.

Using this solution, a 50μ thick polyester film is coated on a spin coater to a thickness of about 2μ. It is exposed under the black separation (depth) of a negative four-color set under a 5 KW MH lamp at a distance of 140 cm for 15 seconds, then developed in the course of 10 seconds by rinsing with water and stained by immersing in a 3% aqueous solution of Diamine Fast Gray BN (C.I. 27,720) at room temperature for 3 minutes, rinsed with water and dried. Using the same coating solution, a further three coatings are then produced analogously, exposed using the particular original copy, developed and stained with one of the following aqueous dyestuff solutions: blue with 2% of Water Blue TBA (C.I. 42,755), red with 1% of Amidorhodamine B (Acid Red 52) or 2% of Lanaperl Red G (C.I. 22,245) and yellow with 1.5% of Alizarin Yellow GG (C.I. 14,025) or 1.5% of Sirius Light Yellow R extra (C.I. 29,025). The particular parts of the image stained previously are not impaired by the repeated operations and are not further changed by the subsequent different color.

A transparent image of the four-color subject which, when viewed on a white substrate, is similar to the proof, is obtained.

At least 30 lines/mm are resolved in the test original copy which is also copied. Another test original copy which is also copied displays clean deep and light parts in all four colors in a 60-screen and 120-screen. The four dyestuffs do not bleed during the multiple treatment with water. This is ascribed to the good absorption of the dyestuffs on the fish glue and the precipitation of the dyestuff salt with incompletely exposed diazo polycondensate at the image areas, which precipitation can be detected even in a test tube experiment.

EXAMPLE 11

In order to show the superiority of the fish glue layer according to the invention over the closest state of the art (DT-OS No. 2,310,825), the following layers were compared with one another:

A. Fish glue layer prepared as follows:

40 g of a fish glue as in Example 2, 2 g of a diazo co-condensate according to Example 3, 0.1 g of $MgSO_4 \cdot 7H_2O$, 0.1 g of Rhodamine 6 GDN extra (C.I. 45,160), and 0.05 g of a non-ionic wetting agent as in Example 2 are dissolved in 200 ml of $H_2O$.

B. Gelatin layer (analogous to Example 6, DT-OS No. 2,310,825):

The pH value of 100 ml of a 10% aqueous solution of a gelatin from Messrs. Scheidemandel AG with an isoelectric point of 8.5, a pH value of 4.4 and a gel strength of 272 Bloom, was adjusted to 7.0 with triethanolamine. 6 ml of a 2.5% aqueous solution of the condensation product of p-diazodiphenylamine and formaldehyde are added to this solution and the mixture is kept at 50° C.

C. Polyvinyl alcohol layer of the following formulation:

8 g of partially saponified PVA of medium viscosity (Moviol 26-88), 1 g of a diazo co-condensate according to Example 3, 0.1 g of Rhodamine 6 GDN extra and 0.05 g of the wetting agent as in A are dissolved in 200 ml of $H_2O$.

All three solutions were applied to polyester films in the same layer thickness (2μ when dry) and dried. For coating, solution B must be warmed to 50° C., in contrast to solutions A and C.

The 20" exposure was effected using a 5 KW MH lamp at a distance of 140 cm for all layers under the same conditions.

The fish glue layer and gelatin layer were stained with a 3% aqueous solution of Benzo Deep Black E extra (C.I. 30,235) within 10' at 50° C. After rinsing with water, the following densities were measured:

|  | Filter combination 395 nm | Wratten 93 |
|---|---|---|
| Fish glue | 1.7 – 2.0 | 1.6 – 1.7 |
| Gelatin | 1.2 – 1.5 | 1.0 – 1.1 |

The sensitivity to light of layer A was found to be 100% better than that of layer B for the continuous tone step wedge which was also copied.

The preferred processing method for the layer of fish glue (A) according to the invention, i.e., first developing and then staining, cannot be used for gelatin layers because these layers cannot be developed with cold water before staining.

Staining for 3 minutes at room temperature in the abovementioned dyestuff solutions, after developing, gives the following densities for layer A:

| Filter combination 395 nm | Wratten 93 |
|---|---|
| 2.4 – 2.6 | 2.1 – |

When the stainability of the three layers with the dyestuff which is preferred for fish glue formulations, i.e., Coranil Direct Black B (C.I. Direct Black 19), is compared, the following density values are obtained for staining before developing in 5% aqueous solution at 50° C. for 10":

|  | Filter Combination 395 nm | Wratten 93 |
|---|---|---|
| Fish glue | 2.0 – 2.2 | 2.1 – 2.6 |
| Gelatin | 1.6 – 1.7 | 1.9 – 2.1 |
| PVA | 1.0 – 1.1 | 0.9 – 1.0 |

Staining for 3 minutes at room temperature with 5% Coranil Direct Black B after developing is possible only in the case of fish glue and PVA and leads to the following densities:

|  | Filter Combination 395 nm | Wratten 93 |
|---|---|---|
| Fish glue | 1.8 – 2.0 | 1.9 – 2.0 |
| PVA | 1.1 – 1.4 | 1.2 – 1.3 |

If layers stained with Benzo Deep Black E extra are immersed in $H_2O$ for a prolonged period and the reduction in the density is then measured, the decrease in the density is about 20% for fish glue and about 40% for gelatin.

The resolution of all three layers is virtually equally good.

It will be obvious to those skilled in the art that many modifications may be made within the scope of the present invention without departing from the spirit thereof, and the invention includes all such modifications.

What is claimed is:

1. In a light-sensitive copying material, the copying layer of which comprises a water-soluble, curable binder and a diazonium salt polycondensation product of recurring units of the general types (A-N$_2$X) and (B)

which are linked to one another by intermediate members which have two bonds and are derived from a carbonyl compound capable of undergoing a condensation reaction, in which A is the radical of a compound of the formula (R$_1$-R$_3$-)$_p$R$_2$-N$_2$X wherein X denotes the anion of an acid which forms a water-soluble salt with the condensation product,
p denotes an integer from 1 to 3,
R$_1$ denotes an aromatic radical with at least one position capable of entering into a condensation reaction,
R$_2$ denotes a phenylene group which is unsubstituted or substituted by halogen atoms or carboxyl, sulfonyl, alkyl or alkoxy groups, and
R$_3$ denotes a single bond or one of the groups:
—(CH$_2$)$_q$—NR$_4$—
—O—(CH$_2$)$_r$—NR$_4$—
—S—(CH$_2$)$_r$—NR$_4$—
—S—CH$_2$CO—NR$_4$—
—O—R$_5$—O—
—O—
—S— or
—CO—NR$_4$—, in which q is a number from 0 to 5, r is a number from 2 to 5, R$_4$ is hydrogen, an alkyl group with 1 to 5 carbon atoms, an aralkyl group with 7 to 12 carbon atoms or an aryl group with 6 to 12 carbon atoms, and R$_5$ is an arylene group with 6 to 12 carbon atoms, and B is the radical of a compound which is free of diazonium groups and is able to undergo a condensation reaction, at least at one point in the molecule, with formaldehyde in an acid medium, which compound is selected from the group consisting of aromtic amines, phenols, thiophenols, phenol ethers, aromatic thioethers, aromatic hydrocarbons, aromatic heterocyclic compounds and organic acid amides, the improvement that fish glue is the water-soluble, curable binder.

2. Copying material according to claim 1 which contains a diazonium salt condensation product in which X is the anion of an aliphatic monosulfonic acid with 1 to 6 carbon atoms.

3. Copying material according to claim 1 in which the fish glue has an average molecular weight of less than 60,000 and is soluble in water with the formation of a clear solution which does not gel above 10° C.

4. Copying material according to claim 1 which additionally contains up to 40% by weight, relative to fish glue, of other water-soluble, polymeric organic compounds.

5. Copying material according to claim 1 in which the copying layer contains 2–40% by weight of a diazonium salt polycondensation product.

6. Copying material according to claim 1 which contains, as the layer carrier, a transparent plastic film.

7. A process for the production of a colored relief image, comprising exposing a copying material according to claim 1 to light, washing out with water the regions of the layer which have not been exposed and staining the residual relief image with an aqueous dyestuff solution.

8. A process according to claim 7 in which the dyestuff used for staining is a reactive dyestuff.

9. A process according to claim 7 in which the dyestuff used for staining is a substantive dyestuff.

10. A process according to claim 7 in which the dyestuff used for staining is an acid dyestuff.

11. A process according to claim 7 in which staining is carried out with a 0.5–5% by weight dyestuff solution.

12. A process according to claim 7 in which the dyestuff is opaque in the UV region of the spectrum but is transparent for visible light.

13. A process according to claim 7 including using a copying material with a transparent layer carrier film and exposing said material from the back through the carrier film under a continuous tone original copy.

* * * * *